United States Patent
Hsiao et al.

(10) Patent No.: US 12,400,609 B2
(45) Date of Patent: Aug. 26, 2025

(54) ELECTRONIC DEVICE AND VEHICLE DISPLAY DEVICE

(71) Applicants: Innolux Corporation, Miaoli County (TW); CARUX TECHNOLOGY PTE. LTD., Singapore (SG)

(72) Inventors: Yu-Hsuan Hsiao, Miaoli County (TW); Ming-Hui Chu, Miaoli County (TW); Hsin-Cheng Hung, Miaoli County (TW); Li-Wei Sung, Tainan (TW)

(73) Assignees: Innolux Corporation, Miaoli County (TW); CARUX TECHNOLOGY PTE. LTD., Singapore (SG)

( * ) Notice: Subject to any disclaimer, the term of this patent is extended or adjusted under 35 U.S.C. 154(b) by 0 days.

(21) Appl. No.: 18/652,802

(22) Filed: May 1, 2024

(65) Prior Publication Data
US 2024/0404480 A1 Dec. 5, 2024

(30) Foreign Application Priority Data
Jun. 1, 2023 (CN) .......................... 202310643451.6

(51) Int. Cl.
*G09G 3/34* (2006.01)
*B60K 35/22* (2024.01)
*F21V 8/00* (2006.01)
*H01L 25/16* (2023.01)

(52) U.S. Cl.
CPC ............ *G09G 3/342* (2013.01); *B60K 35/22* (2024.01); *G02B 6/0068* (2013.01); *G02B 6/0091* (2013.01); *G09G 3/346* (2013.01); *H01L 25/167* (2013.01); *B60K 2360/332* (2024.01); *B60K 2360/349* (2024.01); *G09G 2360/141* (2013.01); *G09G 2360/144* (2013.01); *G09G 2360/145* (2013.01); *G09G 2380/10* (2013.01)

(58) Field of Classification Search
CPC .... G09G 3/342; G09G 3/3426; G09G 3/3406; G09G 3/34
See application file for complete search history.

(56) References Cited

U.S. PATENT DOCUMENTS

2020/0201117 A1* 6/2020 Zheng .................. G02B 5/0205
2024/0316359 A1* 9/2024 Chen .................... A61N 5/0625

FOREIGN PATENT DOCUMENTS

| CN | 113569601 | | 10/2021 |
|---|---|---|---|
| CN | 114500700 | | 5/2022 |
| CN | 118336521 | * | 7/2024 |
| TW | 202101086 | | 1/2021 |

* cited by examiner

*Primary Examiner* — Dennis P Joseph
(74) *Attorney, Agent, or Firm* — JCIPRNET (57) ABSTRACT

An electronic device includes a substrate, visible light units, infrared light units, and a light sensor. The substrate includes a first area and a second area. The visible light units are disposed on the first substrate. The infrared light units are disposed on the first substrate and adjacent to the visible light units. A part of the infrared light units is disposed in the first area, and another part of the infrared light units is disposed in the second area. The light sensor is disposed between the first area and the second area and detects infrared light. The first area has a first infrared light unit density. The second area has a second infrared light unit density. The first infrared light unit density is different to the second infrared light unit density.

20 Claims, 11 Drawing Sheets

ELECTRONIC DEVICE AND VEHICLE DISPLAY DEVICE

CROSS-REFERENCE TO RELATED APPLICATION

This application claims the priority benefit of China application serial no. 202310643451.6, filed on Jun. 1, 2023. The entirety of the above-mentioned patent application is hereby incorporated by reference herein and made a part of this specification.

BACKGROUND

Technical Field

The disclosure relates to an electronic device, and more particularly, to an electronic device and a vehicle display device adapted to integrate multiple infrared light units and multiple visible light units.

Description of Related Art

Electronic devices or spliced electronic devices have been widely used in different fields such as communication, display, vehicle, or aviation. Along with booming development of the electronic devices, the electronic devices are developed towards a trend of thinner and lighter, so that the requirements for reliability or quality of the electronic devices become higher.

SUMMARY

The disclosure provide an electronic device and a vehicle display device, which may integrate multiple infrared light units and multiple visible light units to improve appearance quality of a display image.

According to an embodiment of the disclosure, the electronic device includes a substrate, multiple visible light units, multiple infrared light units, and a light sensor. The substrate includes a first area and a second area. The visible light units are disposed on the first substrate. The infrared light units are disposed on the substrate and adjacent to the visible light units. A part of the infrared light units are disposed in the first area, and another part of the infrared light units are disposed in the second area. The light sensor is disposed between the first area and the second area. The light sensor is configured to detect infrared light. The first area has a first infrared light unit density. The second area has a second infrared light unit density. The first infrared light unit density is different to the second infrared light unit density.

According to an embodiment of the disclosure, the vehicle display device includes a substrate, multiple visible light units, multiple infrared light units, and a light sensor. The substrate includes a driving area and a non-driving area. The visible light units are disposed on the substrate. The infrared light units are disposed on the substrate and adjacent to the visible light units. A part of the infrared light units are disposed in the driving area, and another part of the infrared light units are disposed in the non-driving area. The light sensor is configured to detect infrared light. The light sensor is disposed between the driving area and the non-driving area. The driving area has a first infrared light unit density. The non-driving area has a second infrared light unit density. The first infrared light unit density is different to the second infrared light unit density.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The disclosure may be understood by referring to the following detailed description in collaboration with the accompanying drawings. It should be noted that, in order to make the readers to understand easily and for the simplicity's sake of the drawings, several drawings in the disclosure only depict a part of an electronic device. Also, certain components in the drawings are not drawn to actual scales. In addition, the number and size of each component in the figure are only for illustration, and are not intended to limit the scope of the disclosure.

In the following description and claims, terms such as "containing" and "comprising" are open-ended words, so that they should be interpreted as meaning "including but not limited to . . . ".

It should be understood that when an element or film is referred to as being "on" or "connected to" another element or film, it may be directly on or directly connected to the another element or film, or there is an intervening element or film layer between the two elements (indirect connection). Conversely, when an element is referred to as being "directly on" or "directly connected to" another element or layer, there is no intervening element or layer there between.

Although the terms "first", "second", "third" . . . may be used to describe various constituent elements, the constituent elements are not limited to these terms. These terms are only used to distinguish a single constituent element from other constituent elements in the specification. The same terms may not be used in the claims, but may be replaced by first, second, third . . . according to an order of declarations of the elements in the claims. Therefore, in the following specification, a first constituent element may be a second constituent element in the claims.

In the text, the terms "about", "approximately", "substantially" and "roughly" usually mean within 10%, or within 5%, or within 3%, or within 2%, or within 1%, or within 0.5% of a given value or range. The given number is an approximate number, i.e., in the absence of specific descriptions of "about", "approximately", "substantially" and "roughly", the meanings of "about", "approximately", "substantially", "roughly" may still be implied.

In some embodiments of the disclosure, terms related to bonding and connection, such as "connect" and "interconnect", etc., unless otherwise specified, may mean that two structures are in direct contact, or may also mean that two structures are not in direct contact, and there are other structures located between these two structures. And the terms related to bonding and connection may also include a situation that both structures are movable, or both structures are fixed. In addition, the term "couple" includes any direct and indirect electrical connection means.

In some embodiments of the disclosure, an optical microscope (OM), a scanning electron microscope (SEM), an α-step, an ellipsometer, or other suitable ways may be used to measure an area, width, thickness or height of each element, or a distance or spacing between the elements. In detail, according to some embodiments, a scanning electron microscope may be used to obtain a cross-sectional structure image including elements to be measured, and measure an area, width, thickness or height of each element, or a distance or spacing between the elements.

The electronic device of the disclosure may include a display device, an antenna device, a sensing device or a spliced device, but the disclosure is not limited thereto. The electronic device may be a bendable or flexible electronic device. The electronic device may include, for example, liquid crystal light emitting diodes; the light emitting diodes may, for example, include organic light emitting diodes (OLEDs), mini LEDs, micro LEDs or quantum dot LEDs (for example, QLEDs, QDLEDs), fluorescence, phosphor or other suitable materials, and the materials may be arranged and combined arbitrarily, but the disclosure is not limited thereto. The antenna device may be, for example, a liquid crystal antenna, but the disclosure is not limited thereto. The spliced device may be, for example, a display spliced device or an antenna spliced device, but the disclosure is not limited thereto. It should be noted that the electronic device may be any permutation and combination of the aforementioned devices, but the disclosure is not limited thereto. The electronic device is taken as an example to describe the content of the disclosure below, but the disclosure is not limited thereto.

It should be noted that in the following embodiments, without departing from the spirit of the disclosure, features in several different embodiments may be replaced, reorganized, and mixed to complete other embodiments. As long as the features of the various embodiments do not violate or conflict with the spirit of the disclosure, they may be mixed and used arbitrarily.

Reference will now be made in detail to the exemplary embodiments of the present disclosure, examples of which are illustrated in the accompanying drawings. Wherever possible, the same reference numbers are used in the drawings and descriptions to refer to the same or like parts.

Figure 1A:
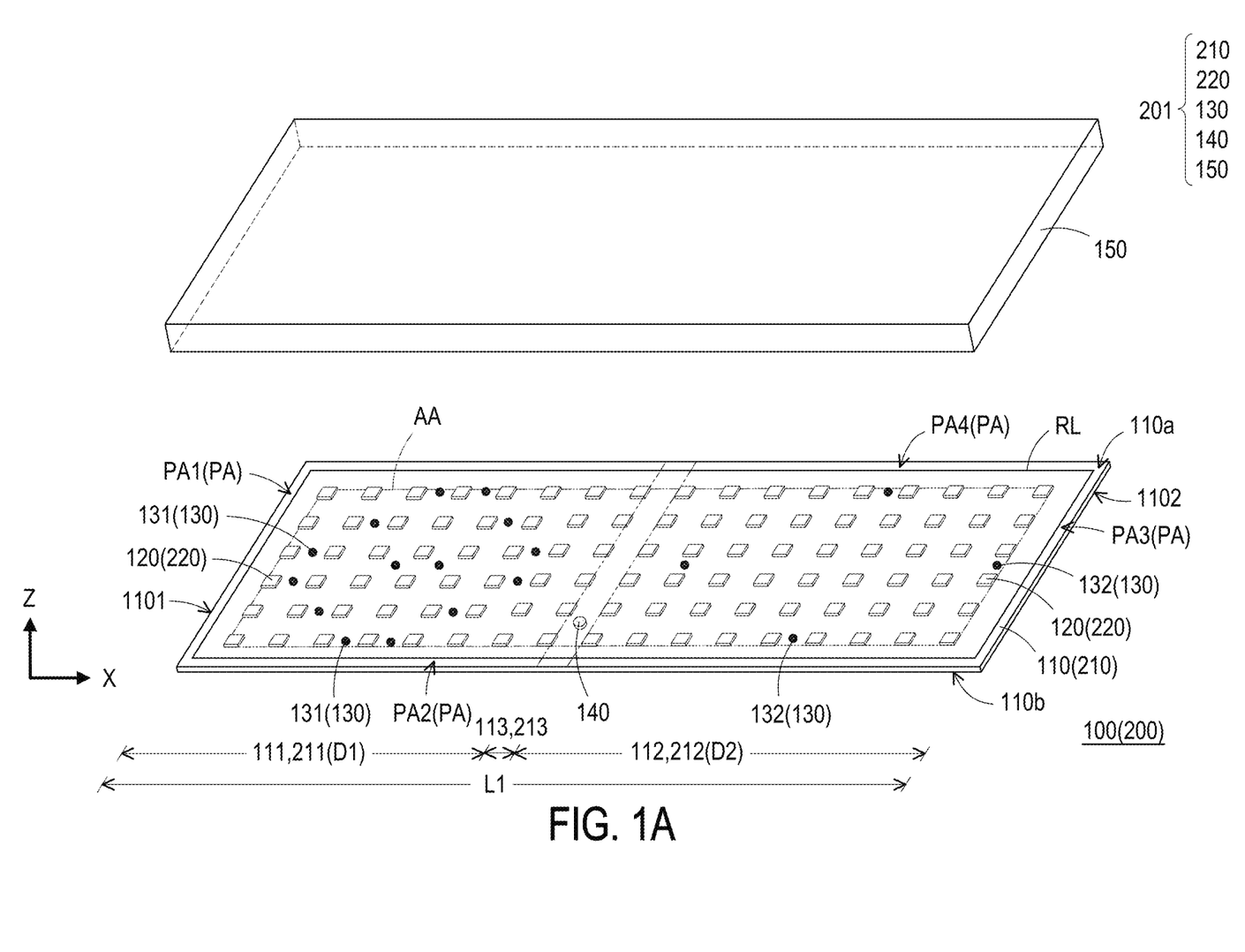
FIG. 1A is a schematic three-dimensional view of an electronic device according to a first embodiment of the disclosure.
Figure 1B:
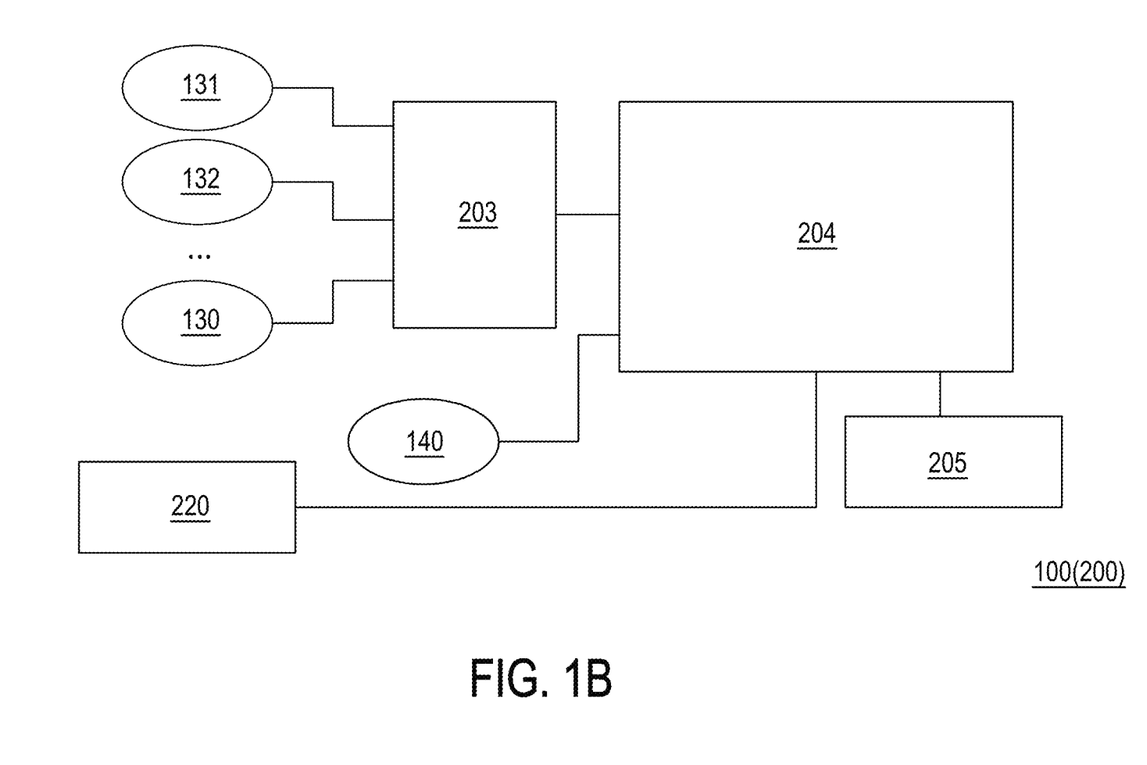
FIG. 1B is a schematic view of an operation of the electronic device in FIG. 1A.

FIG. 1A is a schematic three-dimensional view of an electronic device according to a first embodiment of the disclosure. FIG. 1B is a schematic view of an operation of the electronic device in FIG. 1A. For clarity's sake of the drawings and convenience of description, FIG. 1A omits some elements of an electronic device 100 in FIG. 1B.

Referring to FIG. 1A, the electronic device 100 of the embodiment may include a first substrate 110, multiple visible light units 120, multiple infrared light units 130, a light sensor 140 and a dimming structure 150. The first substrate 110 has a first surface 110a and a second surface 110b opposite to each other, and the first substrate 110 has a first side 1101 and a second side 1102 opposite to each other. The first substrate 110 includes an active area AA and a peripheral area PA adjacent to the active area AA. In the embodiment, the peripheral area PA may, for example, surround the active area AA, but the disclosure is not limited thereto. In the embodiment, the peripheral area PA may have a first side PA1, a second side PA2, a third side PA3 and a fourth side PA4. The first side PA1 and the third side PA3 are opposite to each other, and the second side PA2 and the fourth side PA4 are opposite to each other. In the embodiment, the first substrate 110 may be, for example, a circuit board, and the circuit board may include a single-layer or multi-layer circuit traces. The first substrate 110 may also be, for example, an active driving substrate, and the active driving substrate may include driving circuits (not shown) such as transistors, scan lines, data lines, etc., for driving the visible light units 120. The first substrate 110 may include a rigid substrate, a flexible substrate, or a combination thereof. For example, a material of the first substrate 110 may include glass, quartz, sapphire, ceramics, polycarbonate (PC), polyimide (PI), polyethylene terephthalate (PET), other suitable substrate materials or a combination of the above materials, but the disclosure is not limited thereto.

In the embodiment, the first substrate 110 has a length L1 in an extending direction (a direction X) of the electronic device 100. Where, the length L1 may be, for example, a length of the first substrate 110 measured along the extending direction (the direction X) of the electronic device 100. In some embodiments, the length L1 may also be, for example, the minimum distance measured along the extending direction (direction X) of the electronic device 100 between the first side 1101 and the second side 1102 of the first substrate 110.

In the embodiment, the direction X and a normal direction Z are respectively different directions. The direction X is, for example, the extending direction of the electronic device 100, and the direction X may be substantially perpendicular to the normal direction Z, but the disclosure is not limited thereto.

In the embodiment, the first substrate 110 may include a first area 111, a second area 112 and a third area 113. The third area 113 is disposed between the first area 111 and the second area 112, the first area 111 is adjacent to the third area 113, and the third area 113 is adjacent to the second area 112. In an embodiment, in the extending direction (the direction X) of the electronic device 100, the first area 111, for example, starts from the first side 1101 and extends from the first side 1101 to the second side 1102, and the second area 112 starts from the second side 1102 and extends from the second side 1102 to the first side 1101.

In an embodiment, in the extending direction (the direction X) of the electronic device 100, the first area 111 and the second area 112 may respectively occupy 1/5-1/4, 1/4-1/3, 1/3-2/5, 2/5-1/2 of the length L1 of the electronic device 100, and the third area 113 may occupy 1/5-1/3, 1/3-1/2, 1/2-3/5 of the length L1 of the electronic device 100, but the disclosure is not limited thereto, and the extending direction may be, for example, the long side of the electronic device 100 or a direction perpendicular to the short side.

The visible light units 120 are disposed on the first surface 110a of the first substrate 110. In the embodiment, the visible light units 120 may be disposed in the active area AA of the first substrate 110 in an array arrangement, the active area AA is defined as an area where the visible light units 120 are disposed on the first substrate 110, and the active area AA may correspond to a part of the first area 111 and a part of the second area 112, and the peripheral area PA may correspond to another part of the first area 111 and another part of the second area 112, but the disclosure is not limited thereto. In some embodiments, the visible light units 120 of the embodiment may also be replaced with other electronic elements such as passive elements or active elements, for example, capacitors, resistors, inductors, diodes, transistors, etc. Where, the diodes may include light emitting diodes or photodiodes. The light emitting diodes may be, for example, visible light units including red light emitting diodes, green light emitting diodes, blue light emitting diodes and/or white light emitting diodes, but the disclosure is not limited thereto.

The infrared light units 130 are disposed on the first surface 110a of the first substrate 110. In the embodiment, the infrared light units 130 may be disposed in the active area AA of the first substrate 110, but the disclosure is not limited thereto. Where, a part of infrared light units 131 of the infrared light units 130 may be disposed in the first area 111, and another part of infrared light units 132 of the infrared light units 130 may be disposed in the second area 112. In the embodiment, the infrared light units 130 may be adjacent to the visible light units 120, and the infrared light units 130 may be disposed between the visible light units 120, but the disclosure is not limited thereto. The infrared light units 130 may not be overlapped with the visible light units 120 in the normal direction Z of the first substrate 110.

The first area 111 has a first infrared light unit density D1, and the second area 112 has a second infrared light unit density D2. In the embodiment, the infrared light units 130 are unevenly distributed in the active area AA, a number of the infrared light units 131 in the first area 111 may be different from a number of the infrared light units 132 in the second area 112, and the first infrared light unit density D1 may be different from the second infrared light unit density D2, but the disclosure is not limited thereto. In the embodiment, the first infrared light unit density D1 may be, for example, greater than the second infrared light unit density D2, but the disclosure is not limited thereto. In the embodiment, the first infrared light unit density D1 may be defined as a number of the infrared light units 131 in a unit area of the first area 111, and the second infrared light unit density D2 may be defined as a number of the infrared light units 132 in the unit area of the second area 112. Where, the greater the number of the infrared light units per unit area is, the greater the infrared light unit density is, but the disclosure is not limited thereto. In addition, the unit area may also be, for example, an integral area surrounded by a certain number of the infrared light units. In addition, it should be understood that the larger the integral area surrounded by a fixed number of the infrared light units is, the smaller the infrared light unit density is.

In some embodiments, the first infrared light unit density may also be defined as a distance between two adjacent infrared light units 131 in the first area 111, and the second infrared light unit density may also be defined as a distance between two adjacent infrared light units 132 in the second area 112, where the greater the distance between two adjacent infrared light units is, the smaller the infrared light unit density is.

The light sensor 140 is disposed on the first surface 110a of the first substrate 110. The light sensor 140 may be, for example, used to detect visible light or invisible light. The invisible light may, for example, include infrared, ultraviolet, or other suitable light. In some embodiments, the light sensor 140 may be used to detect images, and includes, for example, an image sensor or multiple light sensing units. The image sensor may include, for example, a photographing element, but the disclosure is not limited thereto. The light sensing unit may, for example, include a photodiode, a phototransistor or other suitable light sensing elements. In the embodiment, the light sensor 140 may be, for example, disposed in the active area AA and disposed in the third area 113 between the first area 111 and the second area 112, but the disclosure is not limited thereto. The light sensor 140 may not be overlapped with the visible light units 120 in the normal direction Z of the first substrate 110. Although FIG. 1A schematically shows the single light sensor 140 disposed in the third area 113, the disclosure does not limit a configuring position and quantity of the light sensor 140. In some embodiments that are not shown, there may be multiple light sensors, and the multiple light sensors may be respectively disposed in the first area and the second area. In some embodiments that are not shown, the third area may further include visible light units and/or infrared light units.

The dimming structure 150 is disposed on the first surface 110a of the first substrate 110 and the visible light units 120. The dimming structure 150 may be used to protect the visible light units 120 or modulate signals of the visible light units 120.

In the embodiment, the electronic device 100 may further include a reflective material layer RL. The reflective material layer RL is disposed on the first surface 110a of the first substrate 110 provided with the infrared light units 130. The reflective material layer RL may be used to reflect infrared light emitted by the infrared light units 130 or reflect light emitted by the visible light units 120 to improve luminous efficiency. For example, the reflective material layer RL may be, for example, used to reflect infrared light with a wavelength of about 900 nm to 1000 nm, and reflectivity of the reflective material layer RL for the infrared light with the wavelength of about 900 nm to 1000 nm may be, for example, more than 90%.

In the embodiment, the electronic device 100 of the embodiment may be applied to a vehicle display device 200 using a non-self-luminous system. Where, the first substrate 110 and the visible light units 120 in the electronic device 100 may be respectively regarded as a first substrate 210 and visible light units 220 of the vehicle display device 200, and the first area 111 and the second area 112 in the first substrate 110 of the electronic device 100 may be respectively regarded as a driving area 211 corresponding to a driver and a non-driving area 212 corresponding to a non-driver in the first substrate 210 of the vehicle display device 200. Where, the first substrate 210 may be regarded as a backlight substrate of a direct-type backlight module or an edge-type backlight module. In an embodiment, a side occupied by the driving area 211 is a driver's side, and occupies ⅕-¼, ¼-⅓, ⅓-⅖, ⅖-½ of a length of the vehicle display device 200 in the extending direction (the direction X) of the vehicle display device 200, a side occupied by the non-driving area 212 is a non-driver's side, and occupies ⅕-¼, ¼-⅓, ⅓-⅖, ⅖-½ of the length of the vehicle display device 200 in the extending direction (the direction X) of the vehicle display device 200, and the extending direction may be, for example, a long side of the display device 200 or the direction perpendicular to the short side. In addition, in an embodiment, the third area 113 may be regarded as a central control area 213 of the vehicle display device 200, the central control area 213 is located between the driving area 211 and the non-driving area 212, and the central control area 213 may occupy ⅕-⅓, ⅓-½, ½-⅗ of the length L1 of the display device 200, but the disclosure is not limited thereto.

Therefore, in the embodiment, the vehicle display device 200 using the non-self-luminous system has a display device 201, and the display device 201 may include the first substrate 210, the visible light units 220, the infrared light units 130, the light sensor 140 and the dimming structure 150. Where, the first substrate 210 may include the driving area 211, the non-driving area 212 and the central control area 213. The visible light units 220 are disposed on the first substrate 210. The infrared light units 130 are disposed on the first substrate 210 and adjacent to the visible light units 220. A part of infrared light units 131 of the infrared light units 130 are disposed in the driving area 211, and another part of infrared light units 132 of the infrared light units 130 are disposed in the non-driving area 212. The light sensor 140 may be used to sense infrared light to implement functions such as face recognition and/or eyeball detection. The light sensor 140 is disposed on the central control area 213 between the driving area 211 and the non-driving area 212. The driving area 211 has the first infrared light unit density D1, the non-driving area 212 has the second infrared light unit density D2, and the first infrared light unit density D1 is different from the second infrared light unit density D2. In the embodiment, the first infrared light unit density D1 of the driving area 211 may be, for example, greater than the second infrared light unit density D2 of the non-driving area 212 (i.e., the number of the infrared light units 131 arranged in the driving area 211 is greater than the number of the infrared light units 132 arranged in the non-driving area 212), so that the detected infrared light signal is clearer and more reliable, so as to clearly determine a state of the driver (for example, whether the driver is dozing off, but the disclosure is not limited thereto). The dimming structure 150 may include a diffuser plate, an optical film, liquid crystal, a polarizer, a color filter and an encapsulation layer, but the disclosure is not limited thereto.

Then, referring to FIG. 1B, in the schematic diagram of the operation of the electronic device 100 of the embodiment applied to the vehicle display device 200, the vehicle display device 200 may further include a local-dimming controller 203, a central control system 204 and power supply 205. Where, the power supply 205 may be used to drive the central control system 204. The central control system 204 may be used to control switches of the visible light units 220. The light sensor 140 may detect the infrared light signal reflected by the driver or non-driver, and feed back the infrared light signal to the central control system 204. The central control system 204 may receive the signal fed back by the light sensor 140, and determine the state of the driver (for example, whether the driver is dozing off, but the disclosure is not limited thereto) or determine whether a power (or brightness) of each infrared light unit 130 needs to be adjusted according to the signal fed back by the light sensor 140, and accordingly adjust the power (or brightness) of each infrared light unit 130 by adjusting the local-dimming controller 203. For example, when the light sensor 140 detects that the brightness of the driving area 211 is relatively dark, the central control system 204 may increase the power (or brightness) of the infrared light units 131 of the driving area 211 by adjusting the local-dimming controller 203. For example, since the state of the non-driver (such as whether the non-driver is dozing off, but the disclosure not limited thereto) is not directly related to driving safety, when the light sensor 140 detects that there is an infrared light signal in the non-driving area 212, the central control system 204 may turn off the infrared light units 132 of the non-driving area 212 by adjusting the local-dimming controller 203, so as to achieve a power saving effect. In some embodiments, the vehicle display device may further include an ambient light sensor (ALS) (not shown) for detecting a brightness of ambient light and feeding it back to the central control system, so that the central control system may adjust the power (or brightness) of each infrared light unit according to the brightness of the ambient light.

Compared with a general display device in which a single infrared light unit and a light sensor are arranged at a frame or a groove outside the display device, the vehicle display device 200 of the embodiment may integrate multiple infrared light units 130 and the light sensor 140 in the display device 201, and may achieve following technical effects: 1. There is no need to configure an additional frame or groove outside the display device 201, so that a shape (such as a rectangle) of the display device or the display image may be more complete; 2. The infrared light emitted by the infrared light units 130 may be diverged through the dimming structure 150, which may reduce poor identification of the light sensor 140 caused by blocking of the single-point light source; 3. To use multiple infrared light units 130 with lower power (or brightness) may reduce a problem of dazzling red dots caused by using a single infrared light unit with higher power (or brightness), thereby improving an appearance quality of the display image; 4. In order to meet actual use requirements, the infrared light units 130 may be arranged in an uneven distribution (for example: the number of the infrared light units 131 in the driving area 211 may be greater than the number of the infrared light units 132 in the non-driving area 212), so as to clearly and reliably detect the state of the driver (such as whether the driver is dozing off, but the disclosure is not limited thereto), and achieve the power saving effect; 5. When the infrared light units 130 are used in collaboration with the local-dimming controller 203, the power (or brightness) of each infrared light unit 130 may be adjusted according to the actual needs to achieve the power saving effect; 6. When the infrared light units 130 are used in collaboration with an ambient light sensor, the power (or brightness) of each infrared light unit 130 may be adjusted according to an intensity of the ambient light, so as to ensure that the light sensor 140 may clearly and reliably detect the infrared light signal.

Other embodiments are listed below for illustration. It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
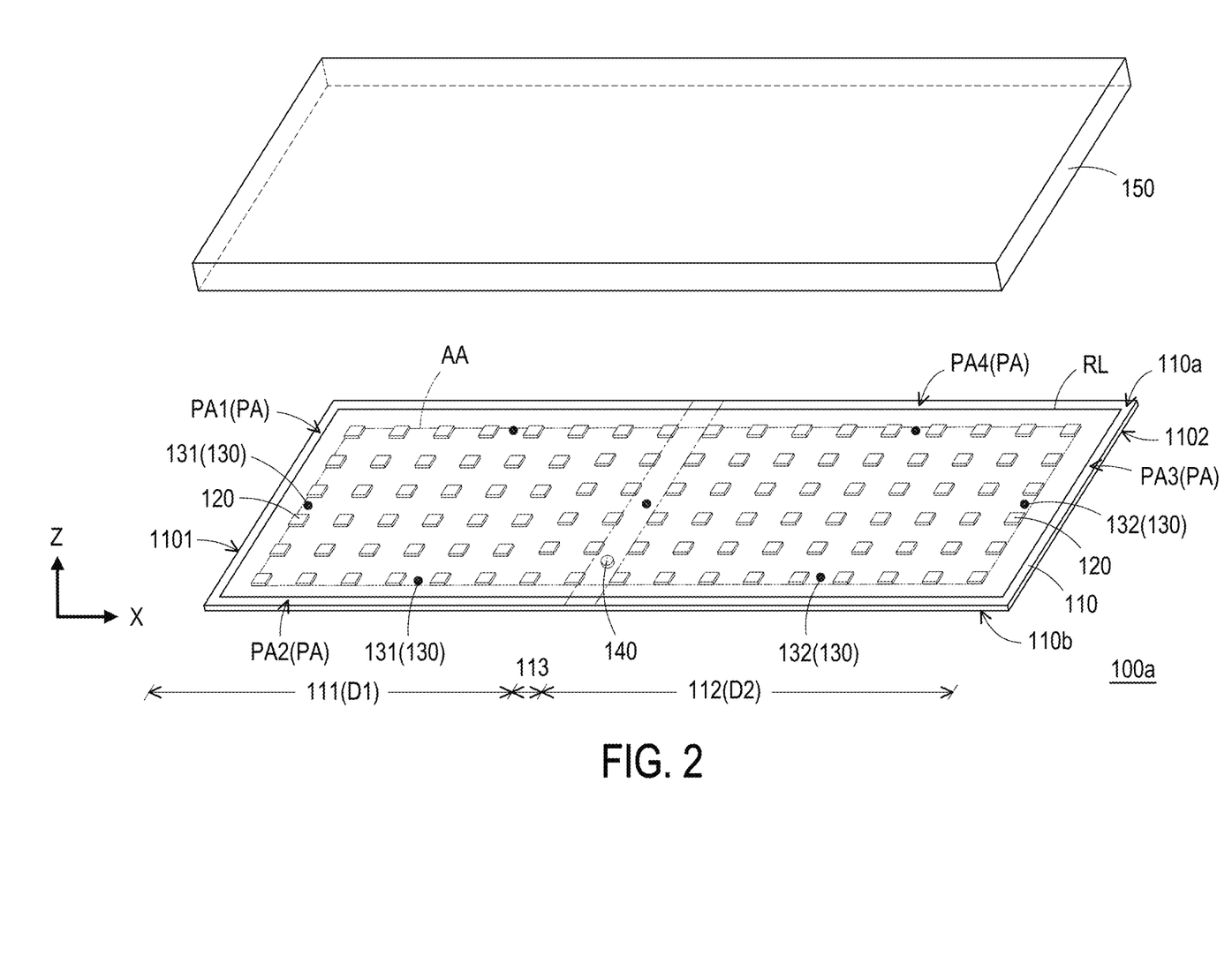
FIG. 2 is a schematic three-dimensional view of an electronic device according to a second embodiment of the disclosure.

FIG. 2 is a schematic three-dimensional view of an electronic device according to a second embodiment of the disclosure. Referring to FIG. 1A and FIG. 2 at the same time, an electronic device 100a of the embodiment is similar to the electronic device 100 of FIG. 1A, and a difference there between is that in the electronic device 100a of the embodiment, the infrared light units 130 may be substantially uniformly disposed in the active area AA. The number of the infrared light units 131 in the first area 111 may be substantially the same as the number of the infrared light units 132 in the second area 112, and the first infrared light unit density D1 may be substantially the same as the second infrared light unit density D2.

Figure 3:
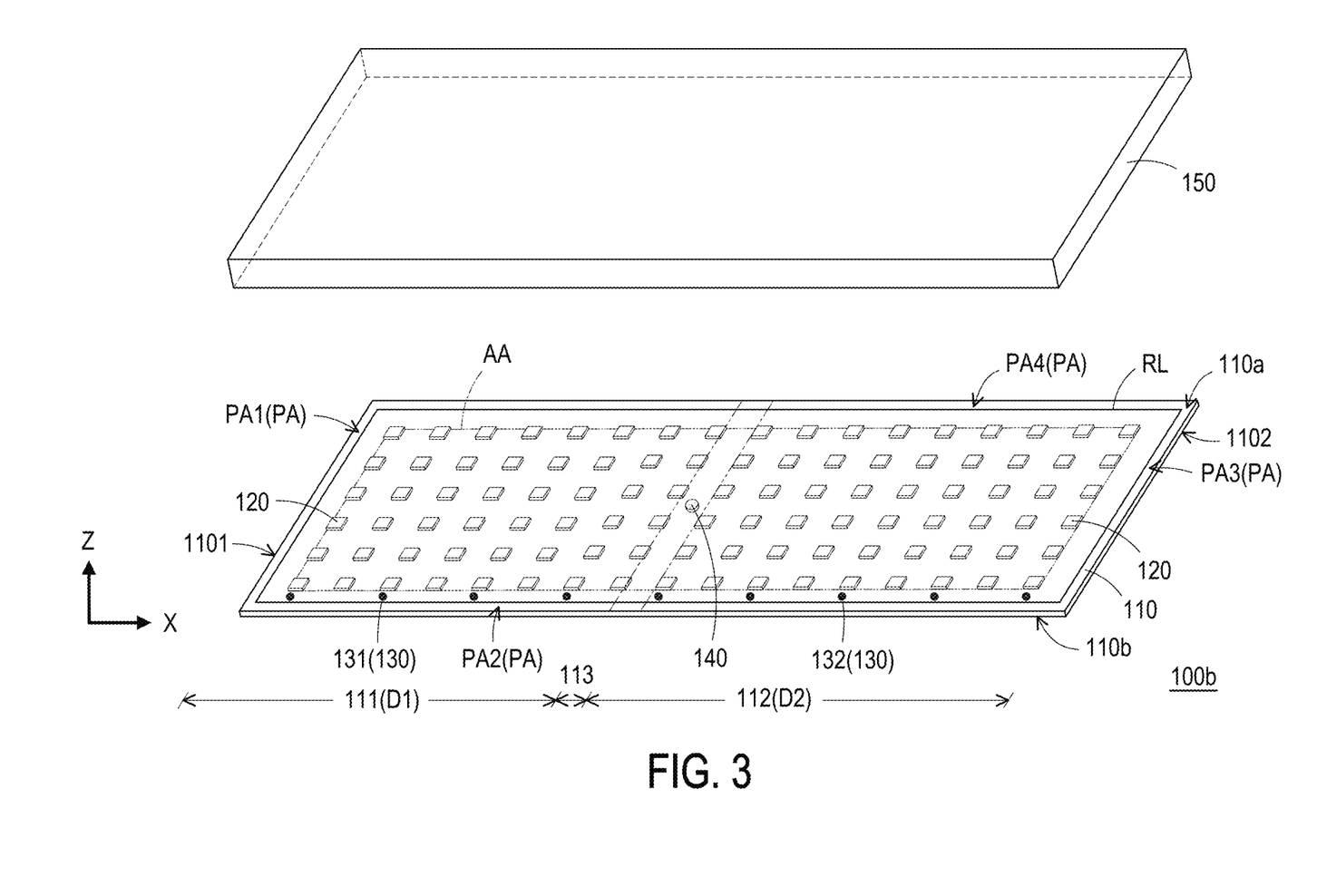
FIG. 3 is a schematic three-dimensional view of an electronic device according to a third embodiment of the disclosure.

FIG. 3 is a schematic three-dimensional view of an electronic device according to a third embodiment of the disclosure. Referring to FIG. 1A and FIG. 3 at the same time, an electronic device 100b of the embodiment is similar to the electronic device 100 of FIG. 1A, and a difference there between is that in the electronic device 100b of the embodiment, the infrared light units 130 are disposed in the peripheral area PA. Where, the infrared light units 130 may be, for example, evenly distributed on the second side PA2 of the peripheral area PA, but the disclosure is not limited thereto. In some embodiments that are not shown, the infrared light units may also be unevenly distributed on the first side PA1, the second side PA2, the third side PA3 and/or the fourth side PA4 of the peripheral area PA.

Figure 4:
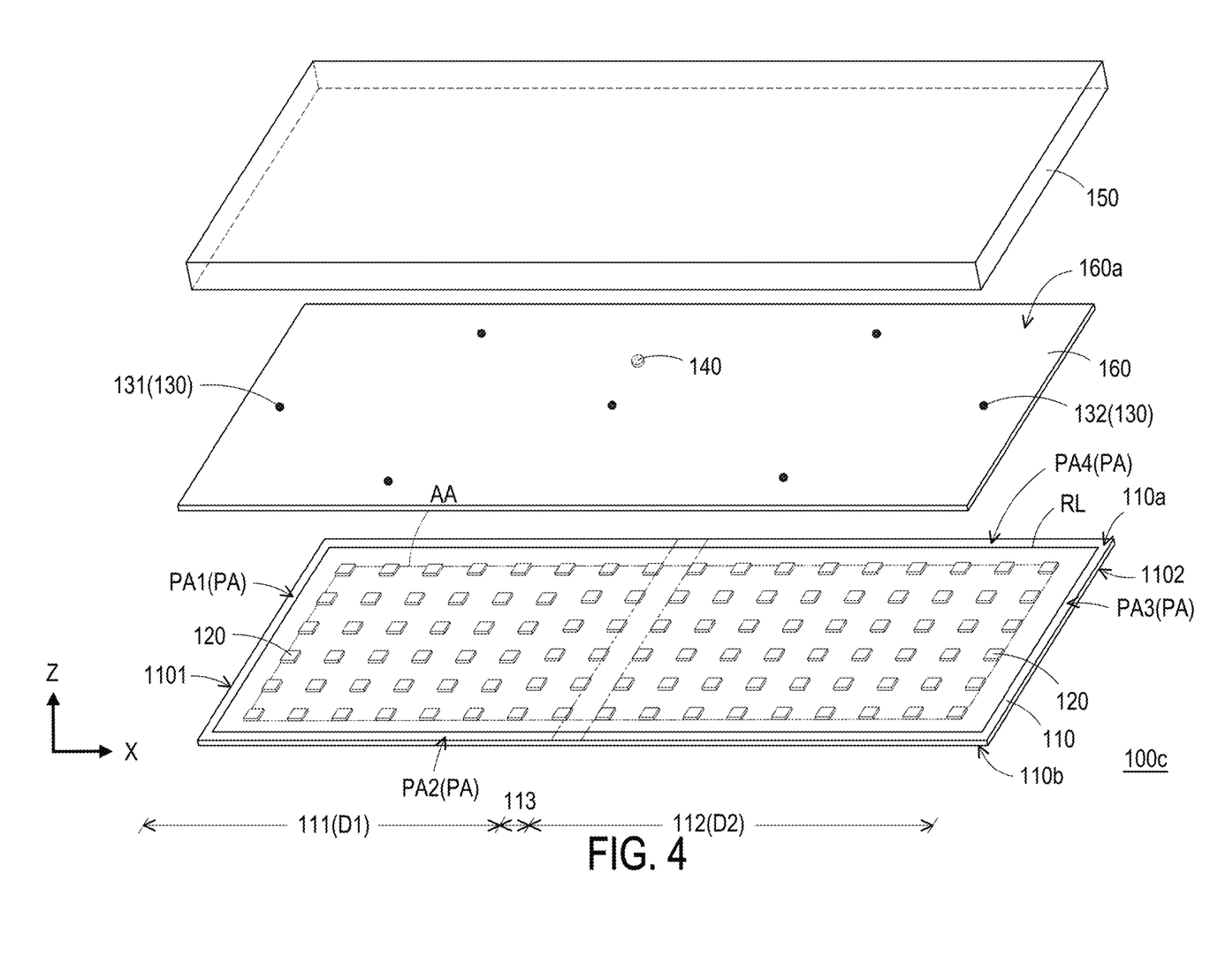
FIG. 4 is a schematic three-dimensional view of an electronic device according to a fourth embodiment of the disclosure.

FIG. 4 is a schematic three-dimensional view of an electronic device according to a fourth embodiment of the disclosure. Referring to FIG. 1A and FIG. 4 at the same time, an electronic device 100c of the embodiment is similar to the electronic device 100 of FIG. 1A, and a difference there between is that the electronic device 100c of the embodiment further includes a second substrate 160. The second substrate 160 is disposed on the first surface 110a of the first substrate 110, and the second substrate 160 is disposed between the dimming structure 150 and the first substrate 110 (or the visible light units 120). The second substrate 160 will not block the signals (such as light) emitted by the visible light units 120. A material of the second substrate 160 may include glass or other light-transmitting substrate materials, but the disclosure is not limited thereto. In the embodiment, the infrared light units 130 and the light sensor 140 are disposed on a surface 160a of the second substrate 160 facing the dimming structure 150 (or facing away from the first substrate 110), and the infrared light units 130 and light sensor 140 may not be overlapped with the visible light units 120 in the normal direction Z of the first substrate 110. The reflective material layer RL for reflecting infrared light is disposed on the surface 160a of the second substrate 160 configured with the infrared light units 130. In an embodiment, a range of the reflective material layer RL disposed on the first substrate 110 may be at least greater than or equal to the active area AA and less than or equal to the first surface 110a of the first substrate 110, and the reflective material layer RL may be used to reflect the infrared light emitted by the infrared light units 130 disposed in the active area AA and the peripheral area PA or reflect the light emitted by the visible light units 120 to improve the luminous efficiency.

Figure 5:
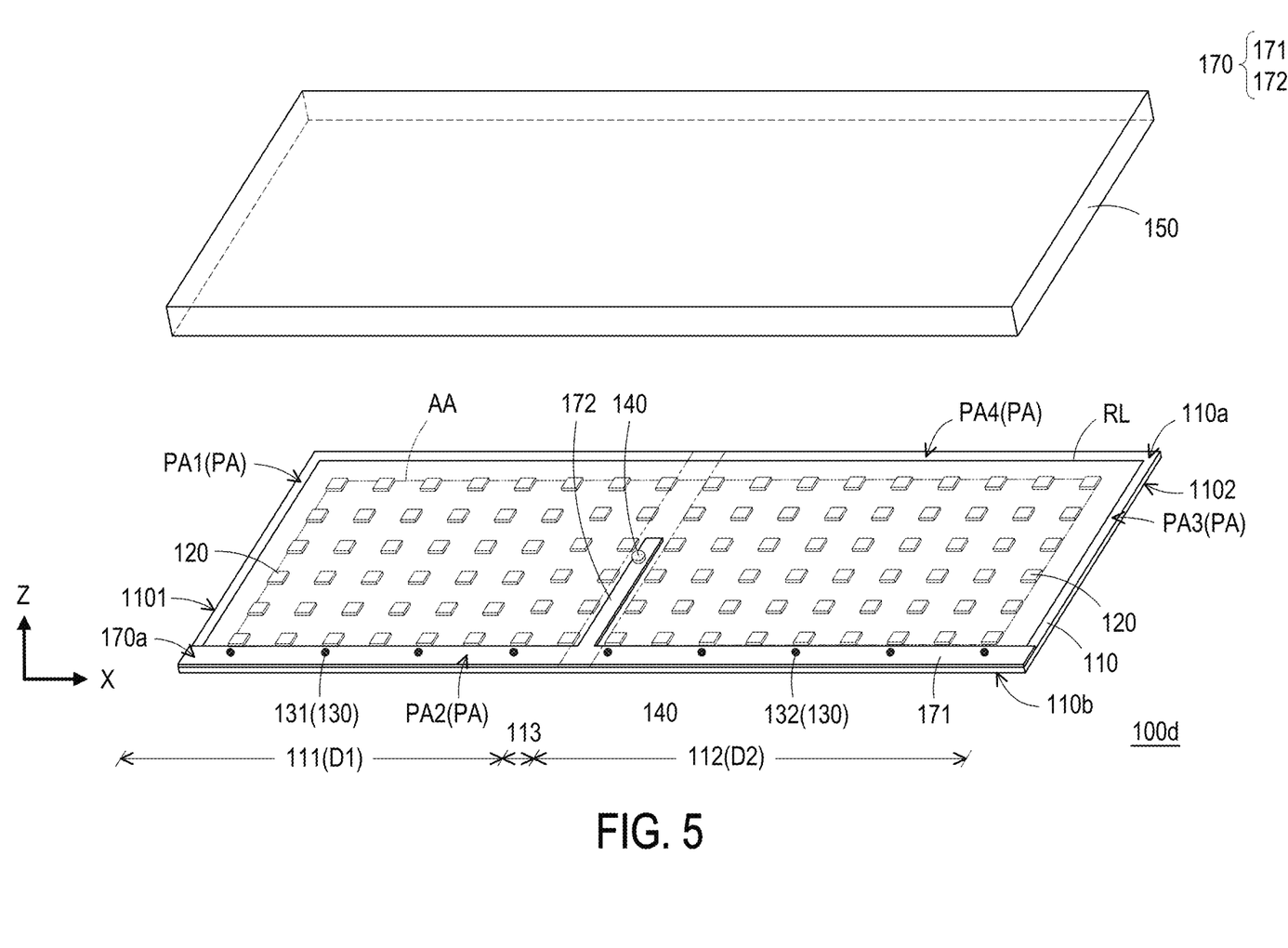
FIG. 5 is a schematic three-dimensional view of an electronic device according to a fifth embodiment of the disclosure.

FIG. 5 is a schematic three-dimensional view of an electronic device according to a fifth embodiment of the disclosure. Referring to FIG. 1A and FIG. 5 at the same time, an electronic device 100d of the embodiment is similar to the electronic device 100 of FIG. 1A, and a difference there between is that the electronic device 100d of the embodiment further includes a third substrate 170. A portion 171 of the third substrate 170 is disposed and attached on the second side PA2 of the peripheral area PA of the first substrate 110, and another portion 172 of the third substrate 170 is disposed and attached to the third area 113 between the first area 111 and the second area 112. In the embodiment, a shape of the third substrate 170 may be, for example, a T-shape, but the disclosure is not limited thereto. The infrared light units 130 and the light sensor 140 are disposed on a surface 170a of the third substrate 170 facing the dimming structure 150 (or facing away from the first substrate 110). The infrared light units 130 are disposed on the portion 171 of the third substrate 170, and the light sensor 140 is disposed on the other portion 172 of the third substrate 170. The infrared light units 130 and the light sensor 140 may not be overlapped with the visible light units 120 in the normal direction Z of the first substrate 110. The reflective material layer RL for reflecting infrared light is disposed on the surface 170a of the third substrate 170 configured with the infrared light units 130. In an embodiment, a configuration range of the reflective material layer RL is at least greater than or equal to the active area AA and less than or equal to the first surface 110a of the first substrate 110.

Figure 6:
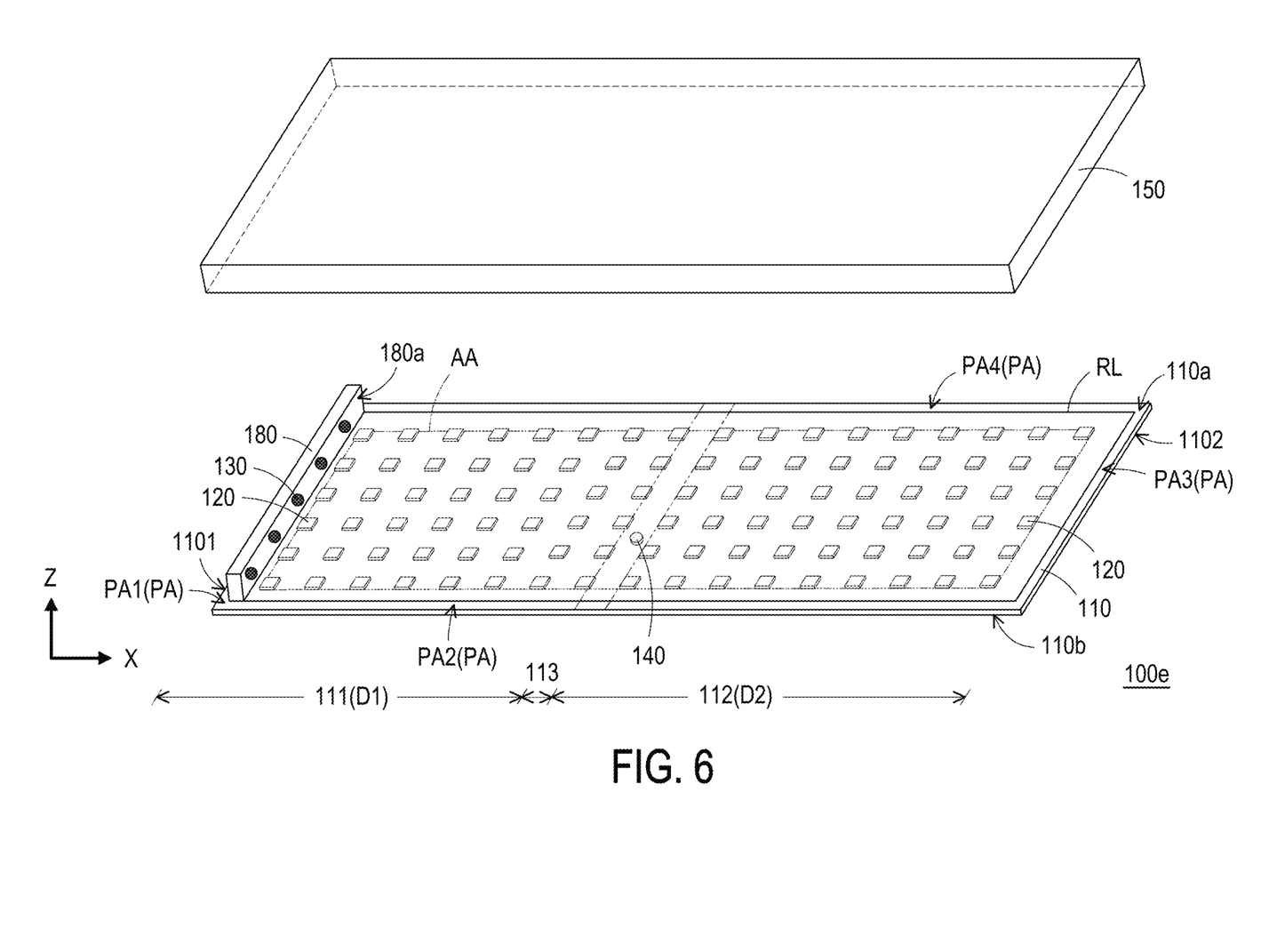
FIG. 6 is a schematic three-dimensional view of an electronic device according to a sixth embodiment of the disclosure.

FIG. 6 is a schematic three-dimensional view of an electronic device according to a sixth embodiment of the disclosure. Referring to FIG. 1A and FIG. 6 at the same time, an electronic device 100e of the embodiment is similar to the electronic device 100 of FIG. 1A, and a difference there between is that the electronic device 100e of the embodiment further includes a side plate 180. The side plate 180 is disposed on the first side PA1 of the peripheral area PA of the first substrate 110. The infrared light units 130 are disposed on a side surface 180a of the side plate 180 facing the active area AA, but the disclosure is not limited thereto. The infrared light emitted by the infrared light units 130 may enter the active area AA in a side-type manner. The side surface 180a of the side plate 180 may be substantially perpendicular to the first surface 110a of the first substrate 110 configured with the visible light units 120. The reflective material layer RL used to reflect the infrared light is disposed on the side surface 180a of the side plate 180 configured with the infrared light units 130. In addition, in an embodiment, a configuration range of the reflective material layer RL may be at least greater than or equal to the active area AA and less than or equal to the first surface 110a of the first substrate 110.

In some embodiments, when the side plate is made of a light-transmitting material, the infrared light units may also be arranged on a side surface of the side plate 180 facing away from the active area AA, and the infrared light emitted by the infrared light units may pass through the side plate to enter the active area AA.

Figure 7:
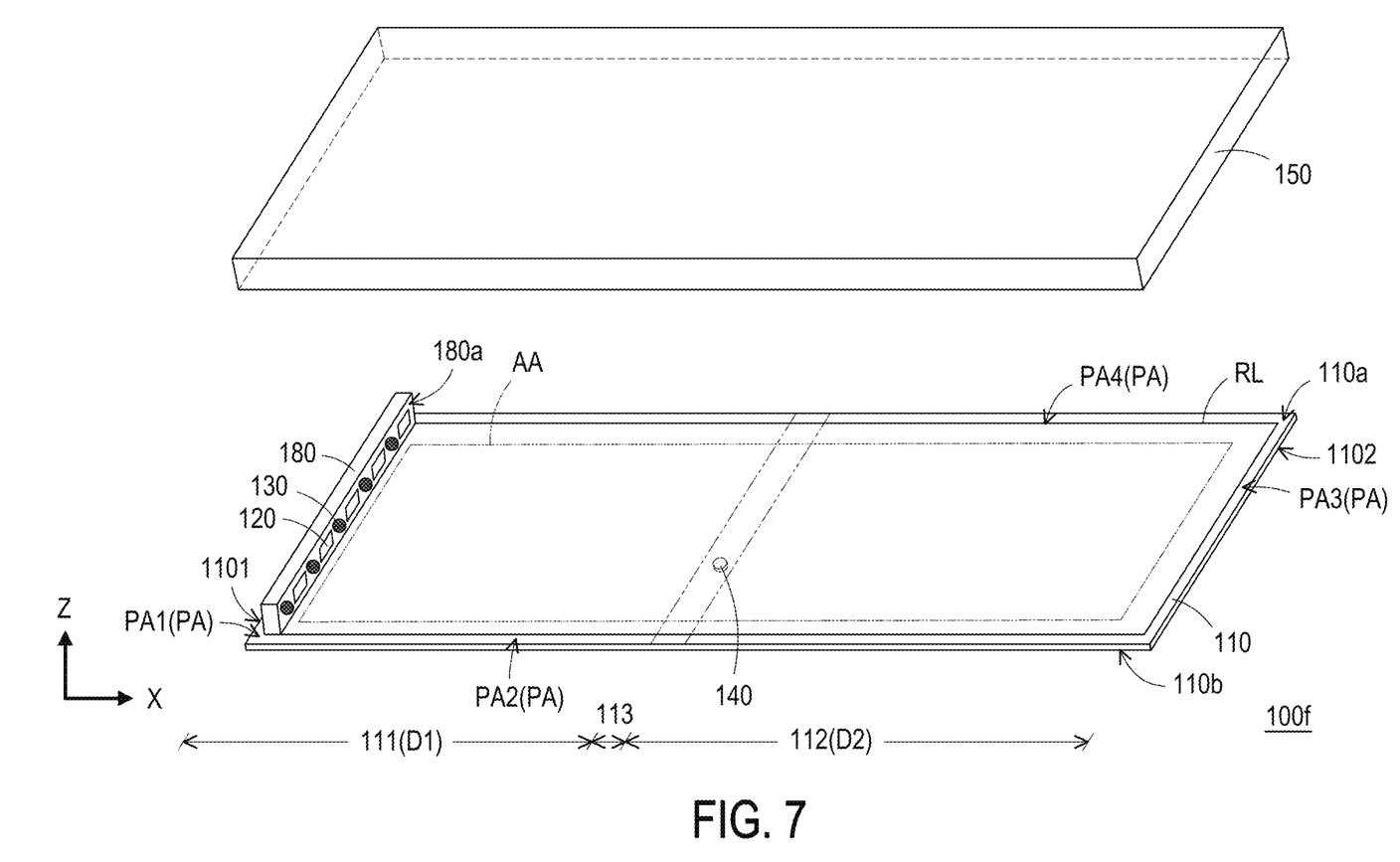
FIG. 7 is a schematic three-dimensional view of an electronic device according to a seventh embodiment of the disclosure.

FIG. 7 is a schematic three-dimensional view of an electronic device according to a seventh embodiment of the disclosure. Referring to FIG. 6 and FIG. 7 at the same time, an electronic device 100f of the embodiment is similar to the electronic device 100e of FIG. 6, and a difference there between is that in the electronic device 100f of the embodiment, the visible light units 120 are also disposed on the side surface 180a of the side plate 180. In this case, the electronic device 100f of the embodiment may be applied to a vehicle display device using a non-self-luminous system and a side-type backlight module.

Figure 8:
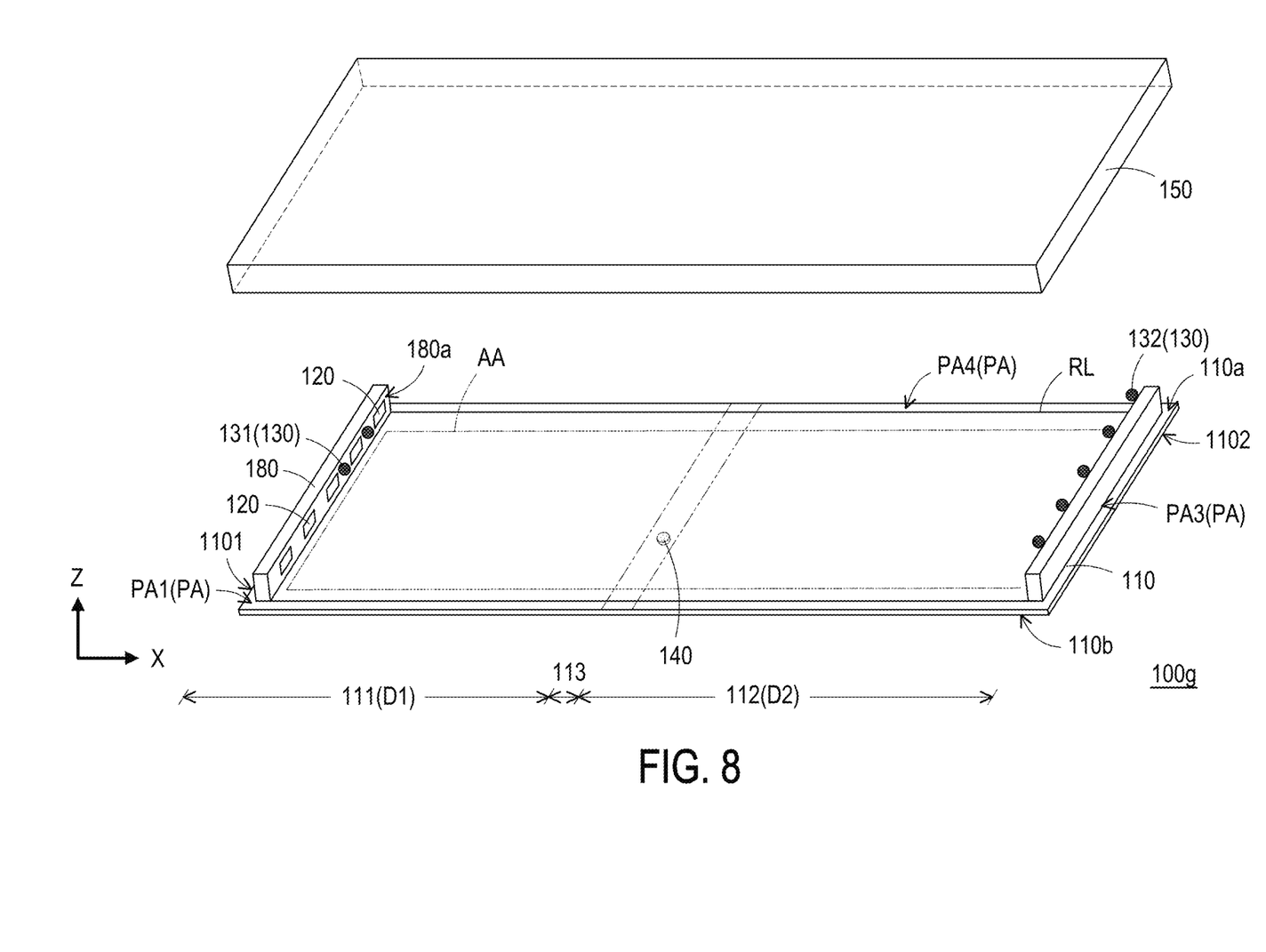
FIG. 8 is a schematic three-dimensional view of an electronic device according to an eighth embodiment of the disclosure.
Figure 9:
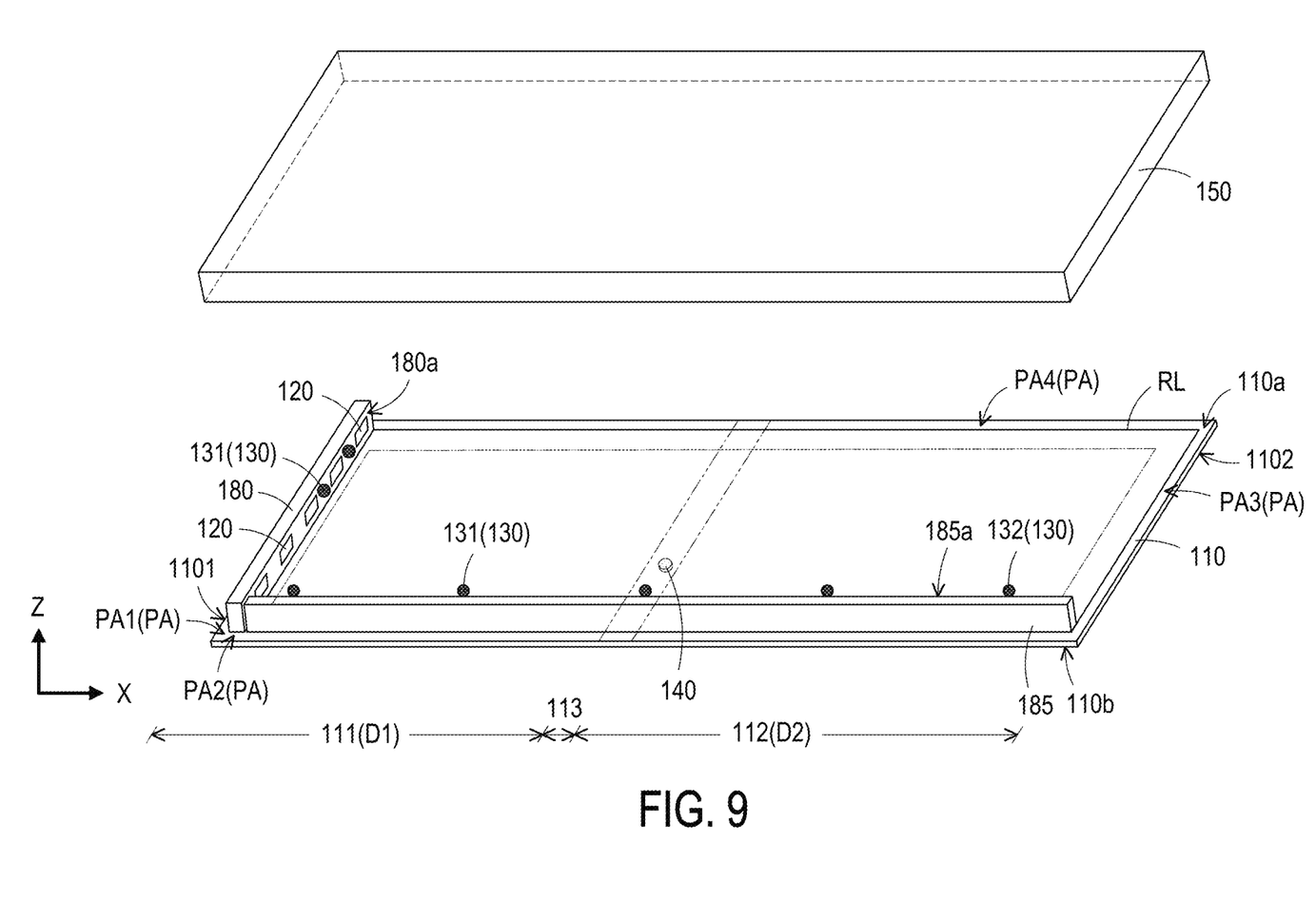
FIG. 9 is a schematic three-dimensional view of an electronic device according to a ninth embodiment of the disclosure.

FIG. 8 is a schematic three-dimensional view of an electronic device according to an eighth embodiment of the disclosure. Referring to FIG. 7 and FIG. 8 at the same time, an electronic device 100g of the embodiment is similar to the electronic device 100f of FIG. 7, and a difference there between is that the electronic device 100g of the embodiment further includes a side plate 185. The side plate 185 is disposed on the third side PA3 of the peripheral area PA of the first substrate 110, and the side plate 185 and the side plate 180 are opposite to each other. The visible light units 120 are disposed on the side surface 180a of the side plate 180. The infrared light units 130 are disposed on the side 180a of the side plate 180 and a side surface 185a of the side plate 185 facing the active area AA. Signals (such as light) emitted by the visible light units 120 and infrared light emitted by the infrared light units 130 enter the active area AA in a side-type manner. The side surface 185a of the side plate 185 may be substantially perpendicular to the first surface 110a of the first substrate 110 configured with the visible light units 120. The reflective material layer RL for reflecting infrared light is disposed on the side surface 180a of the side plate 180 and the side surface 185a of the side plate 185 configured with the infrared light units 130. In an embodiment, a configuration range of the reflective material layer RL may be at least equal to or greater than the active area AA and equal to or less than the first surface 110a of the first substrate 110. FIG. 9 is a schematic three-dimensional view of an electronic device according to a ninth embodiment of the disclosure. Referring to FIG. 8 and FIG. 9 at the same time, an electronic device 100h of the embodiment is similar to the electronic device 100g of FIG. 8, and a difference there between is that in the electronic device 100h of the embodiment, the side plate 185 is disposed on the second side PA2 of the peripheral area PA of the first substrate 110, and the side plate 185 and the side plate 180 are adjacent to each other. The side surface 185a of the side plate 185 may be substantially perpendicular to the side surface 180a of the side plate 180.

Figure 10:
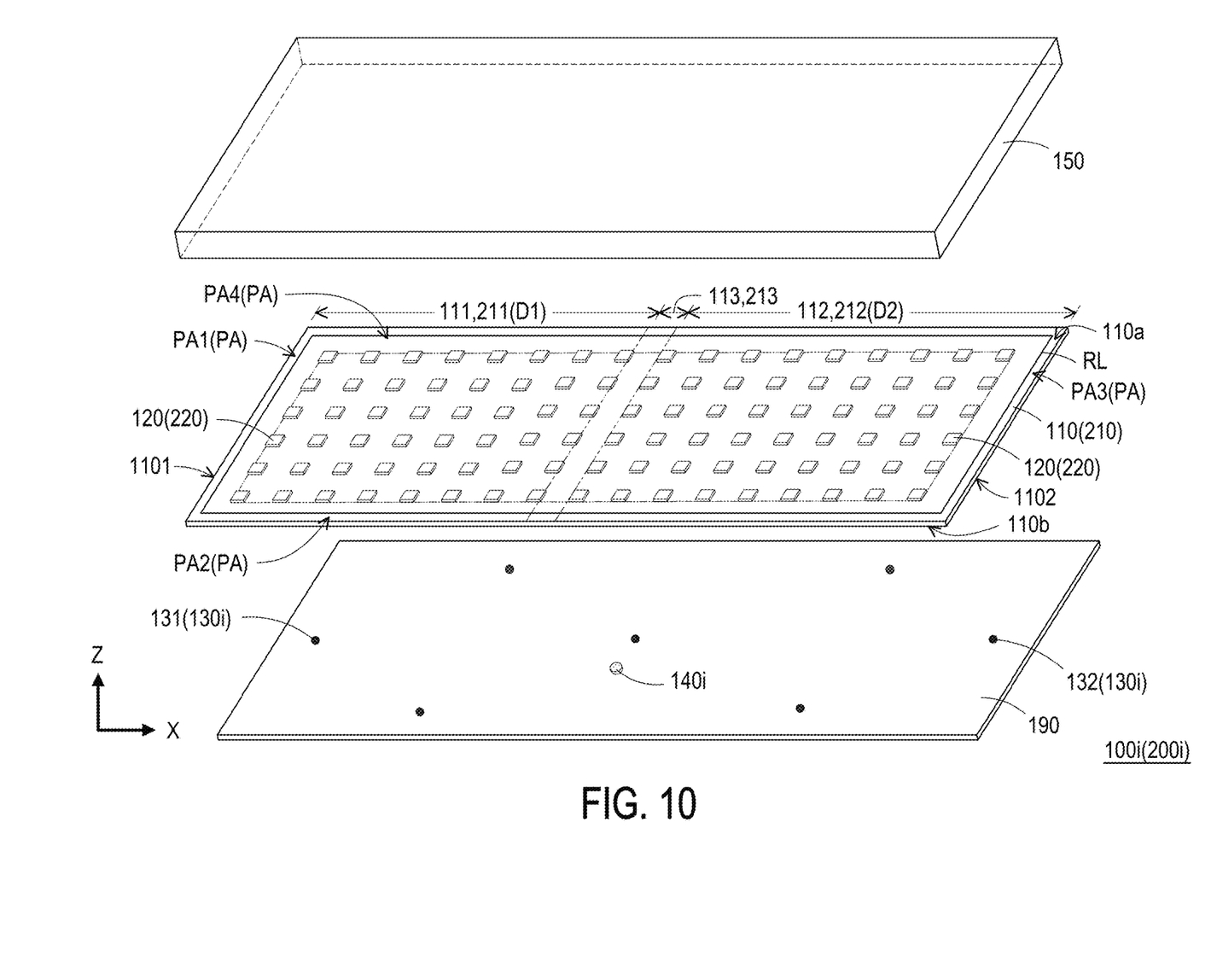
FIG. 10 is a schematic three-dimensional view of an electronic device according to a tenth embodiment of the disclosure.

FIG. 10 is a schematic three-dimensional view of an electronic device according to a tenth embodiment of the disclosure. Referring to FIG. 1A and FIG. 10 at the same time, an electronic device 100i of the embodiment is similar to the electronic device 100 of FIG. 1A, and a difference there between is that the electronic device 100i of the embodiment further includes a fourth substrate 190. The fourth substrate 190 is disposed on the second surface 110b of the first substrate 110 such that the first substrate 110 is located between a dimming structure 150i and the fourth substrate 190. Multiple infrared light units 130i and a light sensor 140i are disposed on a surface 190a of the fourth substrate 190 facing the first substrate 110, and the infrared light units 130i and the light sensor 140i may not be overlapped with the visible light units 120 in the normal direction Z of the first substrate 110. The reflective material layer RL for reflecting infrared light is disposed on the surface 190a of the fourth substrate 190 configured with the infrared light units 130. In an embodiment, a configuration range of the reflective material layer RL may be at least greater than or equal to a range of the fourth substrate 190 corresponding to the active area AA and less than or equal to the surface 190a of the fourth substrate 190. The electronic device 100i of the embodiment may be applied to a vehicle display device 200i using a self-luminous system, and the dimming structure 150i may include a polarizer, a light conversion layer (such as quantum dots), a color filter, an encapsulation layer, an organic material coating, an inorganic material coating, and a transparent substrate, but the disclosure is not limited thereto.

In summary, in the electronic device and the vehicle display device of the embodiments of the disclosure, the design of integrating the infrared light units and the visible light units may achieve the following technical effects: since there is no need to set an additional frame or a groove outside the display device, the shape (such as a rectangle) of the display device or the display image may be more complete; since the infrared light emitted by the infrared light units may be diverged through the dimming structure, poor identification of the light sensor caused by blocking of the single-point light source may be mitigated; since a infrared light units 130 with lower power (or brightness) are used, a problem of dazzling red dots caused by using a single infrared light unit with higher power (or brightness) may be mitigated, thereby improving an appearance quality of the display image; since the infrared light units may be arranged in an uneven distribution (for example: the number of the infrared light units in the driving area may be greater than the number of the infrared light units in the non-driving area), it is able to clearly and reliably detect the state of the driver (such as whether the driver is dozing off, but the disclosure is not limited thereto), and achieve the power saving effect; since the infrared light units 130 may be used in collaboration with the local-dimming controller, the power (or brightness) of each infrared light unit may be adjusted according to the actual needs to achieve the power saving effect; since the infrared light units may be used in collaboration with an ambient light sensor, the power (or brightness) of each infrared light unit may be adjusted according to an intensity of the ambient light, so as to ensure that the light sensor may clearly and reliably detect the infrared light signal.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An electronic device, comprising:
   a first substrate comprising a first area and a second area;
   a plurality of visible light units disposed on the first substrate;
   a plurality of infrared light units disposed on the first substrate and adjacent to the visible light units, wherein a part of the infrared light units are disposed in the first area, and another part of the infrared light units are disposed in the second area; and
   a light sensor disposed between the first area and the second area, and configured to detect infrared light;
   wherein the first area has a first infrared light unit density, the second area has a second infrared light unit density, and the first infrared light unit density is different to the second infrared light unit density.

2. The electronic device according to claim 1, wherein the first infrared light unit density is greater than the second infrared light unit density.

3. The electronic device according to claim 1, wherein the first infrared light unit density is a number of the infrared light units in a unit area of the first area, and the second infrared light unit density is a number of the infrared light units in a unit area of the second area.

4. The electronic device according to claim 1, wherein the first infrared light unit density is a distance between the two adjacent infrared light units in the first area, and the second infrared light unit density is a distance between the two adjacent infrared light units in the second area.

5. The electronic device according to claim 1, further comprising:
a reflective material layer configured to reflect the infrared light emitted by the infrared light units.

6. The electronic device according to claim 1, further comprising:
a dimming structure disposed on the visible light units.

7. The electronic device according to claim 6, further comprising:
a second substrate disposed between the dimming structure and the visible light units,
wherein the infrared light units are disposed on a surface of the second substrate facing away from the first substrate.

8. The electronic device according to claim 1, wherein the first substrate comprises an active area and a peripheral area adjacent to the active area, the active area corresponds to a part of the first area and a part of the second area, the peripheral area corresponds to another part of the first area and another part of the second area, and the infrared light units are disposed in the active area.

9. The electronic device according to claim 1, wherein the first substrate comprises an active area and a peripheral area adjacent to the active area, the active area corresponds to a part of the first area and a part of the second area, the peripheral area corresponds to another part of the first area and another part of the second area, and the infrared light units are disposed in the peripheral area.

10. The electronic device according to claim 9, further comprising:
a third substrate attached to the peripheral area,
wherein the infrared light units are disposed on a surface of the third substrate facing away from the first substrate.

11. The electronic device according to claim 9, further comprising:
a first side plate disposed on a first side of the peripheral area,
wherein the infrared light units are disposed on a side surface of the first side plate facing the active area.

12. The electronic device according to claim 11, wherein the visible light units are disposed on the side surface of the first side plate facing the active area.

13. The electronic device according to claim 11, further comprising:
a second side plate disposed on a third side of the peripheral region, wherein the third side and the first side are opposite each other,
wherein the visible light units are disposed on a side surface of the second side plate facing the active area.

14. The electronic device according to claim 11, further comprising:
a second side plate disposed on a second side of the peripheral region, wherein the second side is adjacent to the first side,
wherein the visible light units are disposed on a side surface of the second side plate facing the active area.

15. The electronic device according to claim 1, wherein the first substrate has a first surface and a second surface opposite to each other, and the electronic device further comprises:
a dimming structure disposed on the first surface; and
a fourth substrate disposed on the second surface,
wherein the first substrate is located between the dimming structure and the fourth substrate, and the infrared light units are disposed on a surface of the fourth substrate facing the first substrate.

16. A vehicle display device, comprising:
a first substrate comprising a driving area and a non-driving area;
a plurality of visible light units disposed on the substrate;
a plurality of infrared light units disposed on the first substrate and adjacent to the visible light units, wherein a part of the infrared light units are disposed in the driving area, and another part of the infrared light units are disposed in the non-driving area; and
a light sensor configured to detect infrared light, and disposed between the driving area and the non-driving area;
wherein the driving area has a first infrared light unit density, the non-driving area has a second infrared light unit density, and the first infrared light unit density is different to the second infrared light unit density.

17. The vehicle display device according to claim 16, further comprising:
a local-dimming controller configured to regulate a power or brightness of each of the infrared light units.

18. The vehicle display device according to claim 17, further comprising:
a central control system receiving a signal fed back by the light sensor, and regulating the local-dimming controller.

19. The vehicle display device according to claim 18, further comprising:
an ambient light sensor configured to detect a brightness of ambient light and feed the brightness back to the central control system.

20. The vehicle display device according to claim 16, wherein a number of the part of the infrared light units is greater than a number of the another part of the infrared light units.

* * * * *